US009083899B2

(12) United States Patent
Mao et al.

(10) Patent No.: US 9,083,899 B2
(45) Date of Patent: Jul. 14, 2015

(54) CIRCUIT STRUCTURE FOR PROVIDING CONVERSION GAIN OF A PIXEL ARRAY

(71) Applicant: OmniVision Technologies, Inc., Santa Clara, CA (US)

(72) Inventors: Duli Mao, Sunnyvale, CA (US); Vincent Venezia, Los Gatos, CA (US); Gang Chen, San Jose, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 372 days.

(21) Appl. No.: 13/773,437

(22) Filed: Feb. 21, 2013

(65) Prior Publication Data
US 2014/0231622 A1 Aug. 21, 2014

(51) Int. Cl.
H01L 27/00 (2006.01)
H01J 40/14 (2006.01)
H03G 3/20 (2006.01)
H04N 5/355 (2011.01)
H01L 27/146 (2006.01)
H04N 5/52 (2006.01)

(52) U.S. Cl.
CPC ........ *H04N 5/3559* (2013.01); *H01L 27/14601* (2013.01); *H04N 5/355* (2013.01); *H04N 5/52* (2013.01)

(58) Field of Classification Search
USPC ................ 250/208.1, 214 R, 214.1, 214 SW, 250/214 AG; 348/272–324; 257/414, 257/431–466
See application file for complete search history.

(56) References Cited

U.S. PATENT DOCUMENTS 8,411,184 B2 * 4/2013 Johnson ........................ 348/308
2009/0321799 A1 * 12/2009 Velichko et al. .............. 257/292

* cited by examiner

*Primary Examiner* — Pascal M Bui Pho
(74) *Attorney, Agent, or Firm* — Blakely Sokoloff Taylor & Zafman LLP

(57) ABSTRACT

Techniques and mechanisms for a pixel array to provide a level of conversion gain. In an embodiment, the pixel array includes conversion gain control circuitry to be selectively configured at different times for different operational modes, each mode for implementing a respective conversion gain. The conversion gain control circuitry selectively provides switched coupling of the pixel cell to—and/or switched decoupling of the pixel cell from—a supply voltage. In another embodiment, the conversion gain control circuitry selectively provides switched coupling of the pixel cell to—and/or switched decoupling of the pixel cell from—sample and hold circuitry.

16 Claims, 5 Drawing Sheets

CIRCUIT STRUCTURE FOR PROVIDING CONVERSION GAIN OF A PIXEL ARRAY

BACKGROUND

1. Technical Field

This disclosure relates generally to image sensors, and in particular, but not exclusively to complementary metal-oxide semiconductor ("CMOS") image sensors.

2. Background Art

Conversion gain of a pixel cell refers to a ratio of a voltage change at a floating diffusion (FD) node of the pixel cell to an amount of charge transferred to the FD node for the voltage change. High conversion gain is advantageous for CMOS image sensors operating under low lighting condition, because the gain is applied at an early stage of a signal sequence, thereby producing comparatively low read noise. However, a high conversion gain typically leads to lower signal to noise ratio (SNR) under comparatively high lighting conditions, when photon shot noise is a dominant noise source. Dual conversion gain (DCG) image sensors have the advantage of high full well capacity (hence higher signal noise ratio) under high light environment and lower read noise under low light environment.

Currently, DCG for a pixel cell is implemented by adding to the pixel cell a capacitor and a controlling transistor, which are coupled in series with one another between a ground voltage and the FD node of the pixel cell. The controlling transistor can be turned on or off based on an exposure control signal to connect or disconnect the capacitor to the FD node, realizing dual conversion gain. However, both the capacitor and controlling transistor take silicon space, resulting in reduced fill factor of a photodiode of the pixel cell. This can be a problem for small pixel size image sensors. As pixel cell sizes continue to shrink, image sensor technology is increasingly sensitive to space inefficient mechanisms for providing conversion gain.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms for implementing any of multiple levels of conversion gain with a pixel array. In current pixel array architectures, various connections to certain traces—e.g. including a readout trace and/or a source follower supply trace—are fixed. For example, a source follower supply trace of a conventional pixel array is typically directly or otherwise fixedly coupled to a node for providing a supply voltage during operation of the pixel array. Moreover, the connection of a readout trace in a conventional pixel array to column readout circuitry (or row readout circuitry) is typically unchanging for one or more different conversion gains of the pixel array. By contrast, a pixel array according to one embodiment includes mechanisms for dynamically changing switched connections each for a respective one of a readout trace and a source follower supply trace, where such dynamic changing is for different respective levels of conversion gain.

Figure 1:
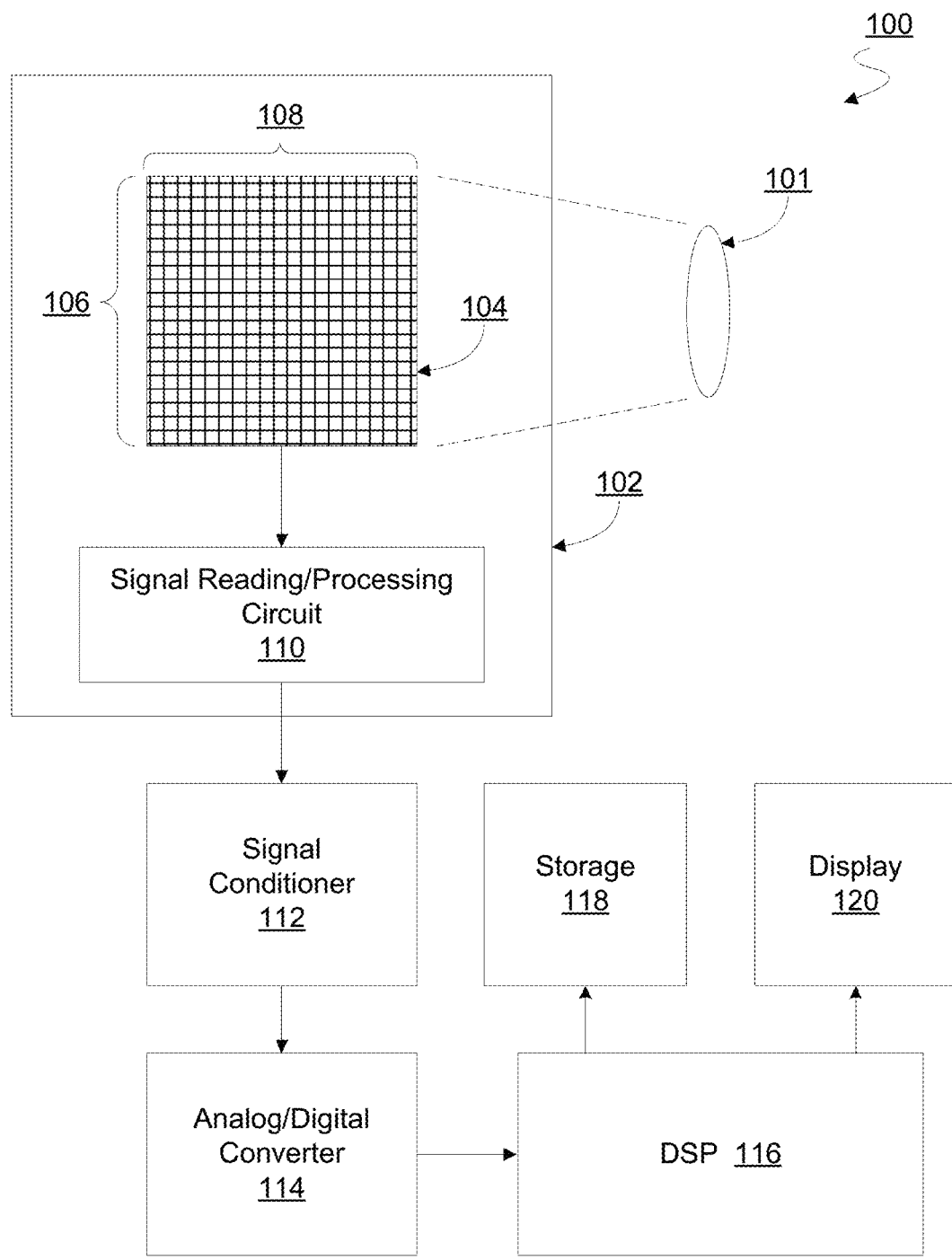
FIG. 1 is a block diagram illustrating elements of an imaging system according to an embodiment.

FIG. 1 shows elements of an imaging system 100 according to an embodiment. Optics 101, which can include refractive, diffractive or reflective optics or combinations of these, may couple to image sensor 102 to focus an image onto pixels in pixel array 104 of image sensor 102. Pixel array 104 may capture the image and the remainder of imaging system 100 may process the pixel data from the image. By way of illustration and not limitation, image sensor 102 may comprise a pixel array 104 and a signal reading and processing circuit 110. Image sensor 102 may, for example, include a pixel array 104 comprising a plurality of pixels arranged in rows 106 and columns 108. During operation of pixel array 104 to capture an image, one or more pixels in pixel array 104 may each capture respective incident light (i.e., photons) during a certain exposure period and convert the collected photons into an electrical charge. The electrical charge generated by each pixel may be read out as an analog signal—e.g. where a characteristic of the analog signal such as its charge, voltage or current is representative of the intensity of light that was incident on the pixel during the exposure period. In an embodiment, pixel array 104 includes a structure or structures for providing conversion gain characteristics for one or more pixel cells.

Illustrated pixel array 104 is regularly shaped, but in other embodiments the array may have a regular or irregular arrangement different than shown and can include more or less pixels, rows, and columns than shown. Moreover, in different embodiments pixel array 104 may be a color image sensor including red, green, and blue pixels designed to capture images in the visible portion of the spectrum, or may be a black-and-white image sensor and/or an image sensor designed to capture images in an invisible portion of the spectrum, such as infra-red or ultraviolet.

In an embodiment, image sensor 102 includes signal reading and processing circuit 110. Among other things, signal reading and processing circuit 110 may include circuitry and logic that reads analog signals from each pixel, filters these signals, corrects for defective pixels, and so forth. In an embodiment where signal reading and processing circuit 110 performs only some reading and processing functions, the remainder of the functions may be performed by one or more other components of imaging system 100 such as signal conditioner 112 or digital signal processor (DSP) 116. Although shown in FIG. 1 as an element separate from pixel array 104, in some embodiments signal reading and processing circuit 110 may be integrated with pixel array 104 on the same substrate or may comprise circuitry and logic embedded within pixel array 104. In other embodiments, however, signal reading and processing circuit 110 is an element external to pixel array 104, as shown in FIG. 1. In still other embodiments, signal reading and processing circuit 110 may be an element not only external to pixel array 104, but also external to image sensor 102.

Signal conditioner 112 may be coupled to image sensor 102 to receive and condition analog signals from pixel array 104 and signal reading and processing circuit 110. In different embodiments, signal conditioner 112 may include various components for conditioning analog signals. Examples of components that may be found in signal conditioner 112 include filters, amplifiers, offset circuits, automatic gain control, etc. In an embodiment where signal conditioner 112 includes only some of these elements and performs only some conditioning functions, other such functions may be performed by one or more other components such as signal reading and processing circuit 110 or DSP 116. Analog-to-digital converter (ADC) 114 may be coupled to signal conditioner 112 to receive from signal conditioner 112 conditioned analog signals corresponding to one or more pixels in pixel array 104. In an embodiment, ADC 114 variously converts such conditioned analog signals into digital values.

DSP 116 may be coupled to analog-to-digital converter 114 to receive digitized pixel data from ADC 114 and process the digital data to produce a digital image. DSP 116 may include an internal memory (not shown) with which it may store and retrieve data. After the image is processed by DSP 116, the image may be output to one or both of a storage unit 118, such as a flash memory or an optical or magnetic storage unit, and a display unit 120 such as an LCD screen.

Figure 2:
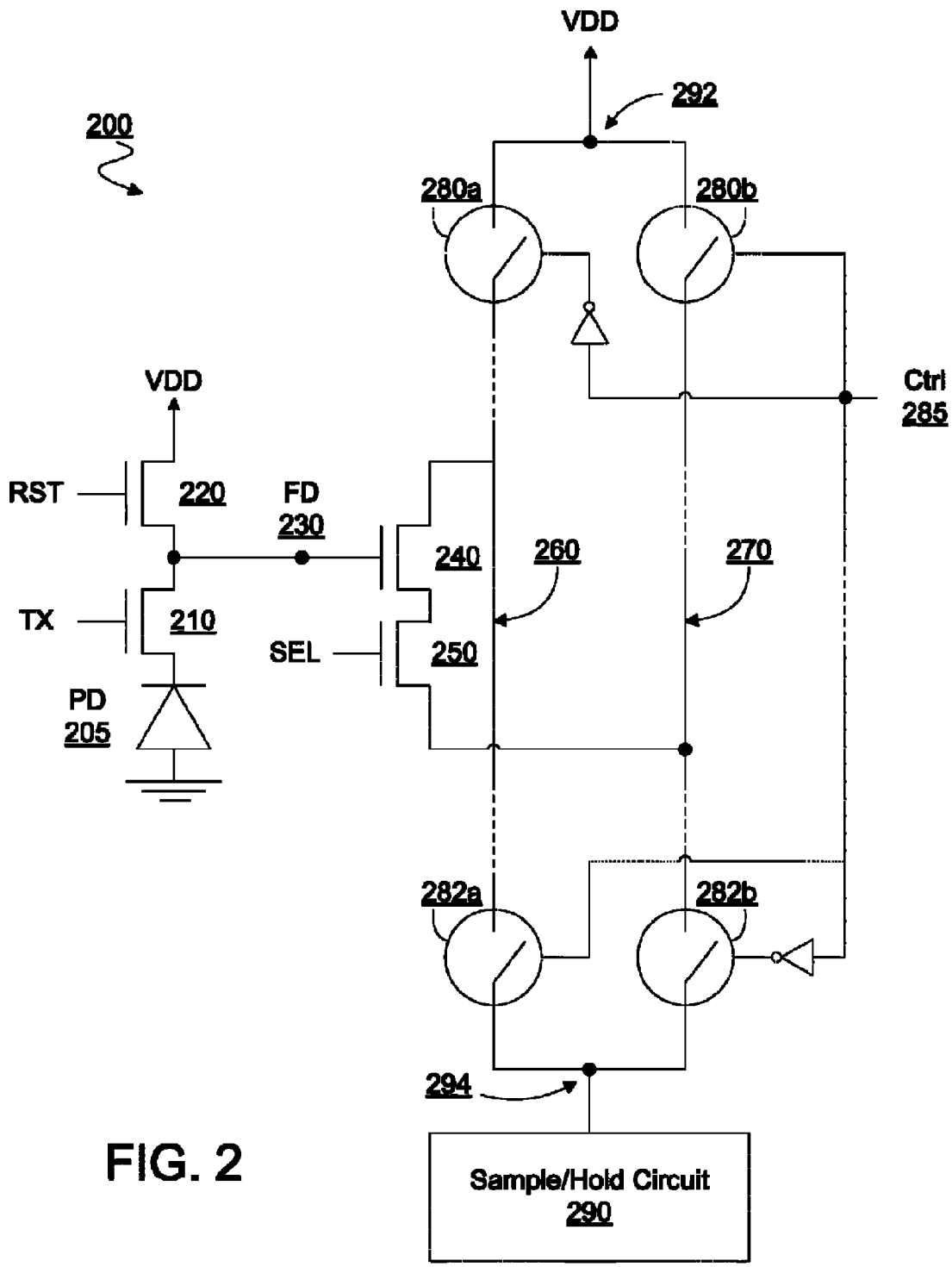
FIG. 2 is a circuit diagram illustrating elements of a pixel array according to an embodiment.

FIG. 2 shows elements of a pixel array 200 including structures for providing one or more conversion gain characteristics according to an embodiment. Pixel array 200 may be operable in a system which implements some or all of the functionality of imaging system 100, for example. In an embodiment, pixel array 200 includes one or more features of pixel array 104.

FIG. 2 shows circuitry for an illustrative four transistor (4T) pixel cell of pixel array 200. The discussion herein of the illustrative 4T pixel cell—e.g. including discussion of certain features of different embodiments—may be extended to additionally or alternatively apply to any of a variety of other pixel cells and/or pixel arrays. The illustrated pixel cell of pixel array 200 may be arranged to provide an output to readout trace 270. In an embodiment, the illustrative pixel cell includes a photosensitive element PD 205, a transfer transistor 210, a reset transistor 220, a source follower transistor 240 and a select transistor 250. However, the pixel cell may include any of a variety of alternative pixel cell architectures—e.g. including a 3T, 5T or other pixel cell architecture—according to different embodiments.

During operation of the pixel cell, transfer transistor 210 may receive a transfer signal TX, which transfers charge accumulated in PD 205 to floating diffusion node FD 230. Reset transistor 220 may be coupled between power supply VDD and FD 230 to reset the pixel (e.g., to discharge or charge FD 230 and/or PD 205 to a preset voltage) under control of reset signal RST. FD 230 may also be coupled to control a gate of source follower transistor 240. Source follower transistor 240 may be coupled between power supply VDD and select transistor 250—e.g. where trace 260, referred to herein as a source follower supply trace, is to provide at least part of a signal path between VDD and source follower transistor 240. In an embodiment, trace 260 is to variously couple VDD to one or more other pixel cells (not shown) of pixel array 200. As discussed herein, source follower transistor 240 may be selectively coupled to VDD via switch circuitry of pixel array 200 which is for facilitating conversion gain control.

Source follower transistor 240 may operate as a source follower providing a high impedance connection to FD 230. Source follower transistor 240 may provide an amplification signal—e.g. where the amplification signal is received by select transistor 250. By way of illustration and not limitation, select transistor 250 may, under control of a select signal SEL, selectively receive the amplification signal and provide an output of the pixel cell to trace 270. In an embodiment, trace 270 is further coupled to variously receive respective output signals of one or more other pixel cells (not shown) of pixel array 200.

In an alternate embodiment, a pixel cell does not include any select transistor—e.g. where the amplification signal is output directly to trace 270. In such an embodiment, the amplification signal is itself the analog output signal of the pixel cell. As discussed herein, select transistor 250—or some other transistor which provides an output signal of the pixel cell—may be selectively coupled to VDD via trace 270 using conversion gain control switch circuitry of pixel array 200.

PD 205 and FD 230 may be reset by temporarily asserting the reset signal RST and the transfer signal TX. An image accumulation window (exposure period) may be commenced by de-asserting the transfer signal TX and permitting incident light to charge PD 205. As photogenerated electrons accumulate on PD 205, its voltage may decrease. The voltage or charge on PD 205 may be indicative of the intensity of the light incident on PD 205 during the exposure period. At the end of the exposure period, the reset signal RST may be de-asserted to isolate FD 230 and the transfer signal TX may be asserted to allow an exchange of charge between PD 205 and FD 230, and hence to the gate of source follower transistor 240. The charge transfer may cause the voltage of FD 230 to change by an amount which is proportional to photogenerated electrons accumulated on PD 205 during the exposure period. This biases source follower transistor 240 which, in combination with the select signal SEL being asserted, may drive a signal from select transistor 250 to trace 270. Data may then be readout from the pixel cell onto trace 270 as an analog signal.

In an embodiment, pixel array 200 includes or is coupled to switch circuitry—also referred to herein as conversion gain control circuitry—which may be selectively configured at different times for different operational modes, each mode for implementing a respective conversion gain. Such conversion gain control circuitry may be operable to selectively provide switched coupling of the illustrated pixel cell to—and/or switched decoupling of the pixel cell from—supply voltage VDD. Additionally or alternatively, such conversion gain control circuitry may be operable to selectively provide switched coupling of the pixel cell to—and/or switched decoupling of the pixel cell from—sample and hold circuitry 290 which is for sampling, and holding a representation of, a signal output from the pixel cell. In an alternate embodiment, sample and hold circuitry 290 is external to pixel array 200— e.g. where sample and hold circuitry 290 is integrated into signal reading/processing circuit 110

By way of illustration and not limitation, conversion gain control circuitry of pixel array 200 may include switch 280a, coupled via a portion of trace 260 to source follower transistor 240, and switch 282a coupled via another portion of trace 260 to source follower transistor 240. The conversion gain control circuitry may further include switch 280b, coupled via a portion of trace 270 to an output terminal of the pixel cell (such as a drain terminal of select transistor 250), and switch 282b coupled via another portion of trace 270 to the output terminal of the pixel cell. Pixel array 200 may include any of a variety of additional or alternative circuitry for controlling conversion gain according to different embodiments discussed herein.

In an embodiment, switches 280a, 280b selectively provide—e.g. independent of one another—switched connectivity of VDD to trace 260 and trace 270, respectively. Switches 280a, 280b may each be coupled to VDD via a node 292, although certain embodiments are not limited in this regard. Supply node 292 may be directly or indirectly coupled to supply voltage VDD for driving source follower transistor 240—e.g. based on a voltage level of FD 230. Alternatively or in addition, switches 282a, 282b may selectively provide—e.g. independent of one another—switched connectivity of sample and hold circuitry 290 to trace 260 and trace 270, respectively. Switches 282a, 282b may each be coupled to sample and hold circuitry 290 via a node 294, although certain embodiments are not limited in this regard.

With such conversion gain control circuitry, pixel array 200 may be configured for either of a first operational mode and a second operational mode. For example, the first operational mode may include switch 280a being in a closed state for providing a signal path between VDD and source follower transistor 240 via trace 260, and switch 282b being in a closed state for providing a signal path between sample and hold circuitry 290 and select transistor 250 via trace 270. The first operational mode may further include switch 280b being in an open state for preventing a signal path between VDD and select transistor 250 via trace 270, and switch 282a being in an open state for preventing a signal path between sample and hold circuitry 290 and source follower transistor 240 via trace 260.

In an embodiment, the second operational mode includes switch 280a being in an open state for preventing a signal path between VDD and source follower transistor 240 via trace 260, and switch 282b being in an open state for preventing a signal path between sample and hold circuitry 290 and select transistor 250 via trace 270. The second operational mode may further include switch 280b being in a closed state for providing a signal path between VDD and select transistor 250 via trace 270, and switch 282a being in a closed state for providing a signal path between sample and hold circuitry 290 and source follower transistor 240 via trace 260. The respective states of switches 280a, 280b, 282a, 282b for variously implementing the first operational mode and the second operational mode may be based on a common dynamic gain control signal Ctrl 285, although certain embodiments are not limited in this regard.

In an illustrative scenario for one embodiment, let C1 represent a coupling capacitance between FD 230 and trace 260, and let C2 represent a coupling capacitance between FD 230 and trace 270. Furthermore, let C0 represent a capacitance at FD 230 which is due to one or more other characteristics of pixel array 200. In the described first mode of pixel array 200, dynamic gain control signal Ctrl 285 is deasserted, resulting in switch 280a being in a closed state—e.g. including an active state of a transistor (not shown) of switch 280a—which switchedly connects trace 260 to VDD. The deasserted Ctrl 285 may further result in switch 280b switchedly being in an open state—e.g. including an inactive state of a transistor (not shown) of switch 280b—which switchedly disconnects trace 270 from VDD. Alternatively or in addition, deasserted Ctrl 285 may result in switch 282a being in an open state which switchedly disconnects trace 260 from sample and hold circuitry 290 and/or result in switch 282b being in a closed state which switchedly connects trace 270 to sample and hold circuitry 290.

In such a first mode of pixel array 200, substantially all of C1 may contribute to a total capacitance of FD 230. Moreover, in such a first mode, a contribution C2' of capacitance C2 to the total capacitance of FD 230 is given by the following:

$$C2'=C2(1-A), \qquad (1)$$

where A is a gain of the source follower transistor 240. Accordingly, in such a first mode, a combined capacitance Chi at FD 230 which is attributable to capacitive coupling with traces 260, 270 may be represented as:

$$Chi=C1+C2'=C1+C2(1-A). \qquad (2)$$

In the described second mode of pixel array 200, dynamic gain control signal Ctrl 285 is asserted, resulting in switch 280a switchedly disconnecting trace 260 from VDD and/or resulting in switch 280b switchedly connecting trace 270 to VDD. Alternatively or in addition, the asserted Ctrl 285 may result in switch 282a switchedly connecting trace 260 to sample and hold circuitry 290 and/or result in switch 282b switchedly disconnecting trace 270 from sample and hold circuitry 290.

In such a second mode of pixel array 200, substantially all of C2 may contribute to a total capacitance of FD 230, where a contribution C1' of capacitance C1 to the total capacitance of FD 230 is given by the following:

$$C1'=C1(1-A). \qquad (3)$$

Accordingly, in such a second mode of pixel array 200, a combined capacitance Clo of FD 230 which is attributable to capacitive coupling with traces 260, 270 may be represented as:

$$Clo=C2+C1'=C2+C1(1-A). \qquad (4)$$

The capacitances Chi, Clo each contribute to a different respective level of conversion gain for the corresponding operational mode of pixel array 200.

Figure 3:
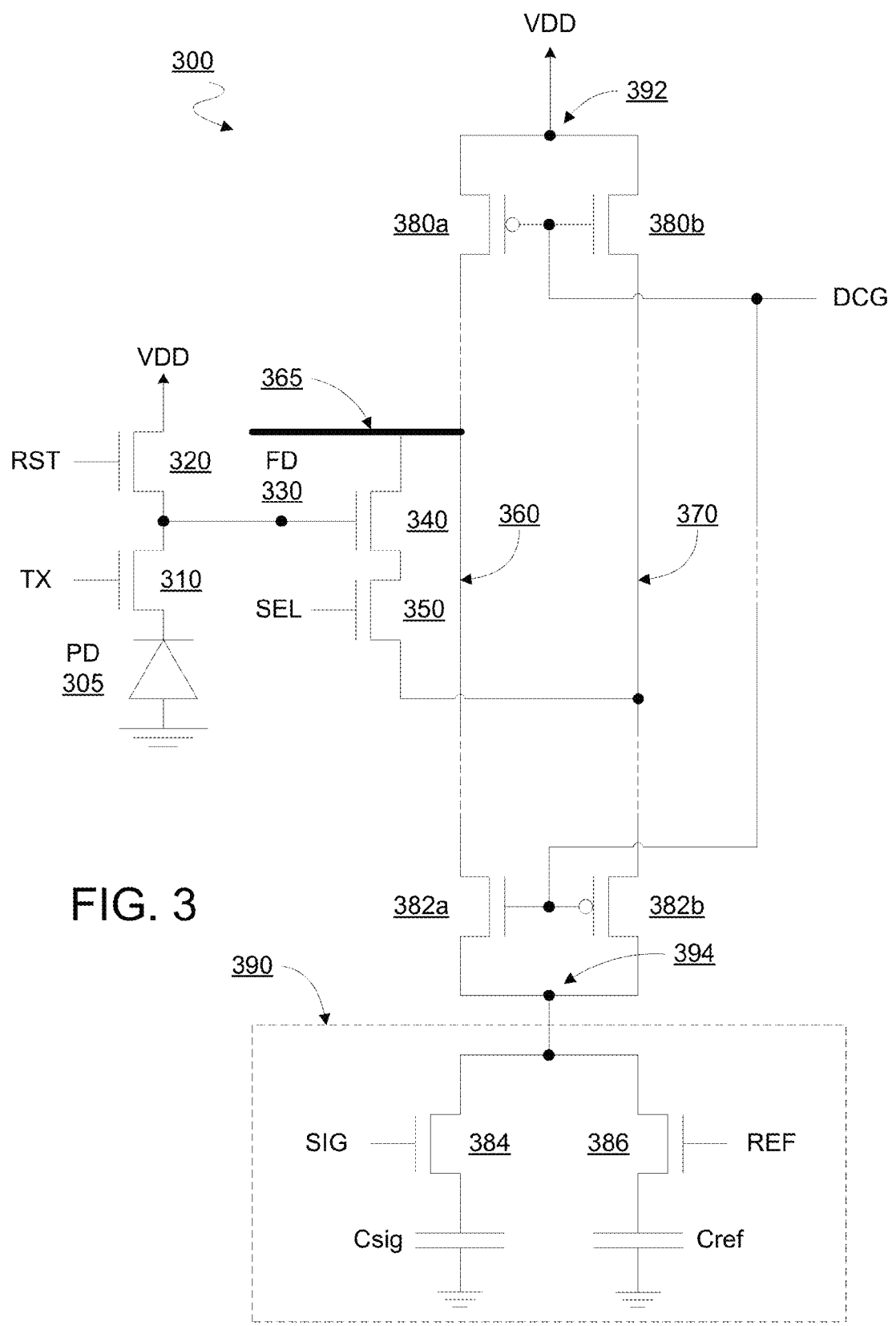
FIG. 3 is a circuit diagram illustrating elements of a pixel array according to an embodiment.

FIG. 3 shows elements of a pixel array 300 including structures for providing conversion gain characteristics according to an embodiment. Pixel array 300 may include some or all of the features of pixel array 200. FIG. 3 shows circuitry for an illustrative four transistor (4T) pixel cell of pixel array 300. In an embodiment, the pixel cell comprises photodetector 305, transfer transistor 310, reset transistor 320, source follower transistor 340 and select transistor 350, which provide functionality corresponding, respectively, to that of PD 205, transfer transistor 210, reset transistor 220, source follower transistor 240 and select transistor 250. The pixel cell may further comprise a floating diffusion region FD 330 coupled to a source follower supply trace 360—e.g. where FD 330 and trace 360 correspond to FD 230 and trace 260, respectively. A trace 370 of pixel array 200, corresponding to trace 270, may receive an output signal from the pixel cell. Traces 360, 370 may each facilitate operation of multiple pixel cells in a column (or alternatively, a row) of pixel array 300.

In the illustrative embodiment of pixel array 300, switch circuitry for dual conversion gain—e.g. circuitry comprising transistors 380a, 380b, 382a, 382b—is variously included at the top and bottom of a column (or alternatively, of a row) in pixel array 300 to dynamically provide for various switched coupling and/or decoupling of traces 360, 370. Any of a variety of other pixel array architectures may be adapted to include mechanisms for variously implementing such operational modes according to different embodiments. Functionality of transistors 380a, 380b, 382a, 382b may correspond, respectively, to that of switches 280a, 280b, 282a, 282b. A node 392 of pixel array 300, similar to node 292, may couple one or both of transistors 380a, 380b to VDD. In an embodiment, a respective active state of one of transistors 380a, 380b, 382a, 382b enables a signal to be conducted between a source terminal of the transistor and a drain terminal of the transistor. Conversely, a respective inactive state of such a transistor may prevent such signal conducting. The active state and inactive state of such a transistor may correspond functionally to a closed switch state and an open switch state, respectively.

In an embodiment, pixel array 300 includes or is coupled to sample and hold circuitry 390 which, for example, is coupled between node 394 and a ground or other reference voltage. Sample and hold circuitry 390 may include, for example, capacitor Csig and transistor 384 in series with one another, and capacitor Cref and transistor 386 coupled in series with one another and in parallel with Csig and transistor 384.

In an embodiment, FD 330 and traces 360, 370 are, respectively, FD 230 and traces 260, 270. In such an embodiment, C1 represents the coupling capacitance between FD 330 and trace 360, C2 represents the coupling capacitance between FD 330 and trace 370, and C0 represents the capacitance at FD 330 which is due to one or more other characteristics of pixel array 300. Although certain embodiments are not limited in this regard, trace 360 may further comprise a branch portion 365 which extends from a main (or "trunk") portion of supply trace 360 to provide for increased capacitive coupling between FD 330 and supply trace 360. For example, due to branch portion 365, the coupling capacitance C1 between the FD 330 and trace 360 may be much higher than the coupling capacitance C2 between FD 330 and trace 370.

In an illustrative scenario according to one embodiment, C0 is equal to 1 femtoFarad (fF), C1 is equal to 0.6 fF, C2 is equal to 0.1 fF, and source follower gain A is equal to 0.9. A control signal DCG—e.g. Ctrl 285—may be used to select between a first total capacitance Ccghi at FD 330 and a second total capacitance Ccglo at FD 330, where:

$$Ccghi = C0 + Chi = 1\ fF + [(0.6\ fF) + (0.1\ fF)(0.1)] = 1.61\ fF, \quad (5)$$

$$Ccglo = C0 + Clo = 1\ fF + [(0.1\ fF) + (0.6\ fF)(0.1)] = 1.16\ fF. \quad (6)$$

In such a scenario, a conversion gain difference of ~40% may be achieved. This is a considerable improvement in variation between conversion gain levels, considering the relatively small area needed to include switches 380a, 380b, 382a, 382b (and, in an embodiment, branch portion 365) for multiple pixel cells in a column (or row) of pixel array 300.

Certain embodiments are not limited to the use of a structure such as branch portion 365 to implement different levels of conversion gain with pixel array 300. For example, pixel array 300 may alternatively include no such branch portion 365 and/or may include any of a variety of one or more circuit elements coupled for C1 to be larger than C2. With such a large C1, as compared to C2, switch circuitry of pixel array 300 may implement greater variation between conversion gain levels—e.g. using transistors 380a, 380b, 382a, 382b based on control signal Ctrl 285.

Figure 4:
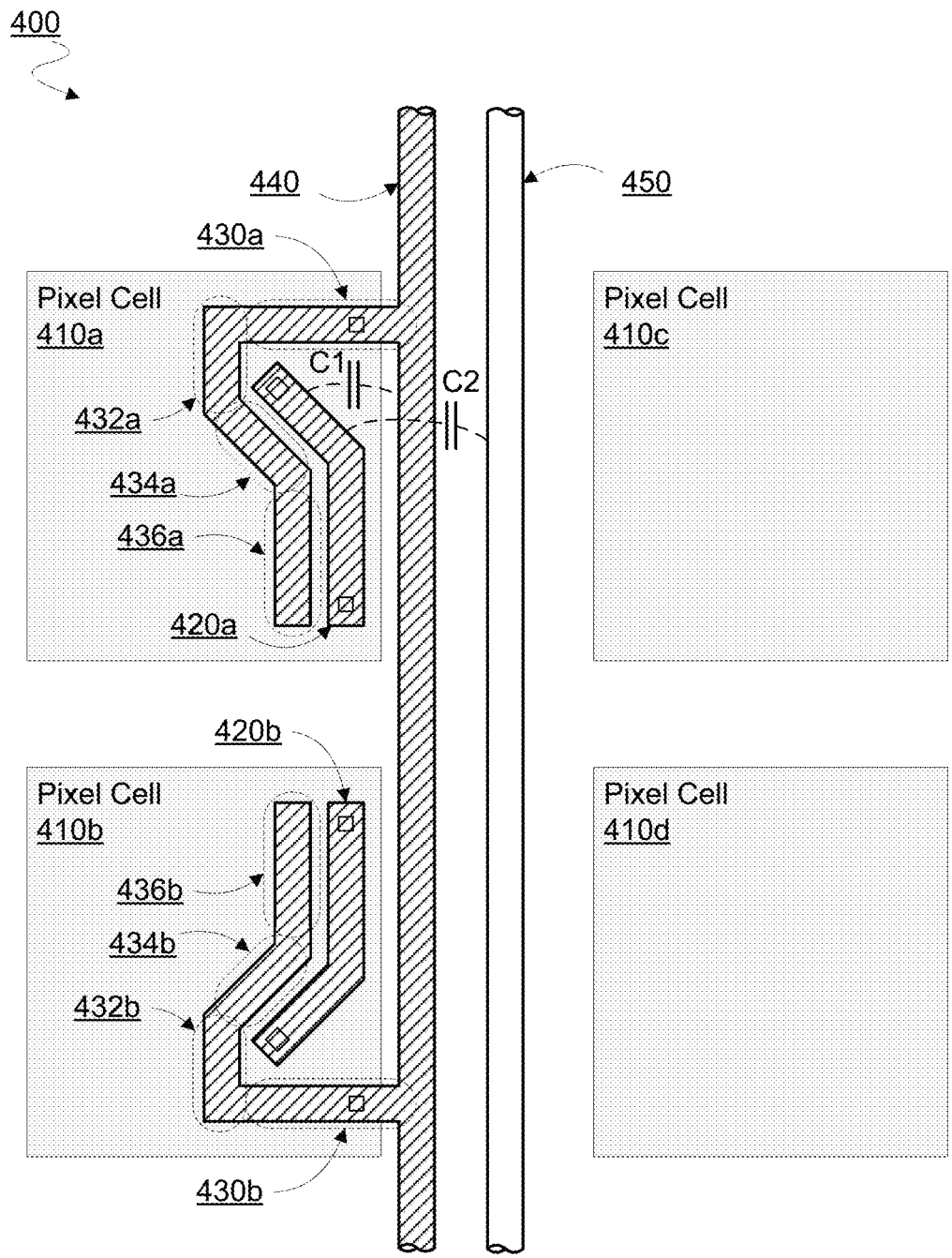
FIG. 4 is a layout diagram illustrating elements of a pixel array according to an embodiment.

FIG. 4 shows elements of a pixel array 400 including structures for providing conversion gain characteristics according to an embodiment. Pixel array 400 may be operable in a system which implements some or all of the functionality of imaging system 100, for example. In an embodiment, pixel array 400 includes one or more features of pixel array 200.

Pixel array 400 may include a plurality of pixel cells arranged in rows and columns—e.g. the plurality of cells including illustrative pixel cells 410a, 410b, 410c, 410d. Pixel array 400 may include any of a variety of additional or alternative pixel cells and/or arrangement of pixel cells, according to different embodiments. The discussion herein of illustrative pixel cell 410a—e.g. including discussion of certain features of different embodiments—may be extended to additionally or alternatively apply to pixel cells 410b, 410c, 410d and/or any of a variety of other pixel cells of pixel array 400.

Pixel cell 410a may be arranged to provide an output to readout trace 450 of pixel array 400. Functionality of trace 450 may correspond, for example, to that of trace 270 and/or that of trace 370. To avoid obscuring features of certain embodiments, an output connection between pixel cell 410a and trace 450 is not shown in FIG. 4. Pixel cell 410a may be a 4T pixel cell, although certain embodiments are not limited in this regard. By way of illustration and not limitation, pixel cell 410a may include some or all of the features of the pixel cell illustrated in FIG. 3. In an embodiment, pixel cell 410a includes a floating diffusion region and a source follower transistor (not shown) having functionality which, for example, corresponds to that of FD 330 and source follower transistor 340, respectively. The floating diffusion region and a gate of the source follower transistor may be coupled to one another by a trace 420a of pixel cell 410a.

Pixel array 400 may further include source follower supply trace 440 which is coupled to a terminal (e.g. source or drain) of the source follower transistor of pixel cell 410a and which is further coupled—directly or indirectly—to a supply voltage for driving the source follower transistor of pixel cell 410a. Functionality of trace 440 may correspond, for example, to that of trace 260 and/or that of trace 360. Trace 440 may further extend to couple to one or more other pixel cells of pixel array 400, such as pixel cell 410b.

In an embodiment, a trunk portion of trace 440 is to exchange current between the supply voltage and the terminal of the source follower transistor of pixel cell 410a. A branch potion of trace 440 may extend from such a trunk portion to provide, at least in part, for a comparative increase of a capacitance C1 between the trace 440 and the trace 420a. Capacitance C1 may be the parasitic capacitance which, for example, includes a metal-to-metal capacitance between trace 440 and trace 420a. The branch portion may include a connection point (e.g. to a via represented by a square overlapped by sub-portion 430a of the branch portion) for electrical connection to the source follower transistor, although certain embodiments are not limited in this regard.

Such a branch portion of trace 440 may include one or more component sub-portions which each variously extend in parallel with, and proximate to, a respective portion of trace 420a. In an illustrative embodiment, the branch portion includes sub-portions—e.g. represented by illustrative sub-portions 430a, 432a, 434a, 436a—which extend along different lines of direction to conform at least in part to a non-linear shape of trace 420a. By way of illustration and not limitation, one or more of sub-portions 430a, 432a, 434a, 436a may each include a side, at least part of which faces a nearest side of trace 430. Such facing sides may, for example, be separated from one another by a distance of not more than 0.05 μm to 0.5 μm. In an embodiment, the facing sides are proximate to one another along a length of at least 0.3 μm to 5 μm. In an embodiment, the branch portion of trace 440 which is proximate to trace 420a contributes to capacitance C1 having a greater magnitude than a capacitance C2 between trace 420a and trace 450.

One or more other pixel cells of pixel array 400 may include structures similar to those of pixel cell 410a. By way of illustration and not limitation, pixel cell 410b may include a trace 420b having functionality corresponding to that of trace 420a. Alternatively or in addition, another branch potion may extend from the trunk portion of trace 440, where the other branch portion is to provide, at least in part, for a capacitance between the trace 440 and the trace 420b. In an illustrative embodiment, this other branch portion includes sub-portions—e.g. represented by illustrative sub-portions 430b, 432b, 434b, 436b—which extend along different lines of direction to conform at least in part to a non-linear shape of trace 420b.

Figure 5:
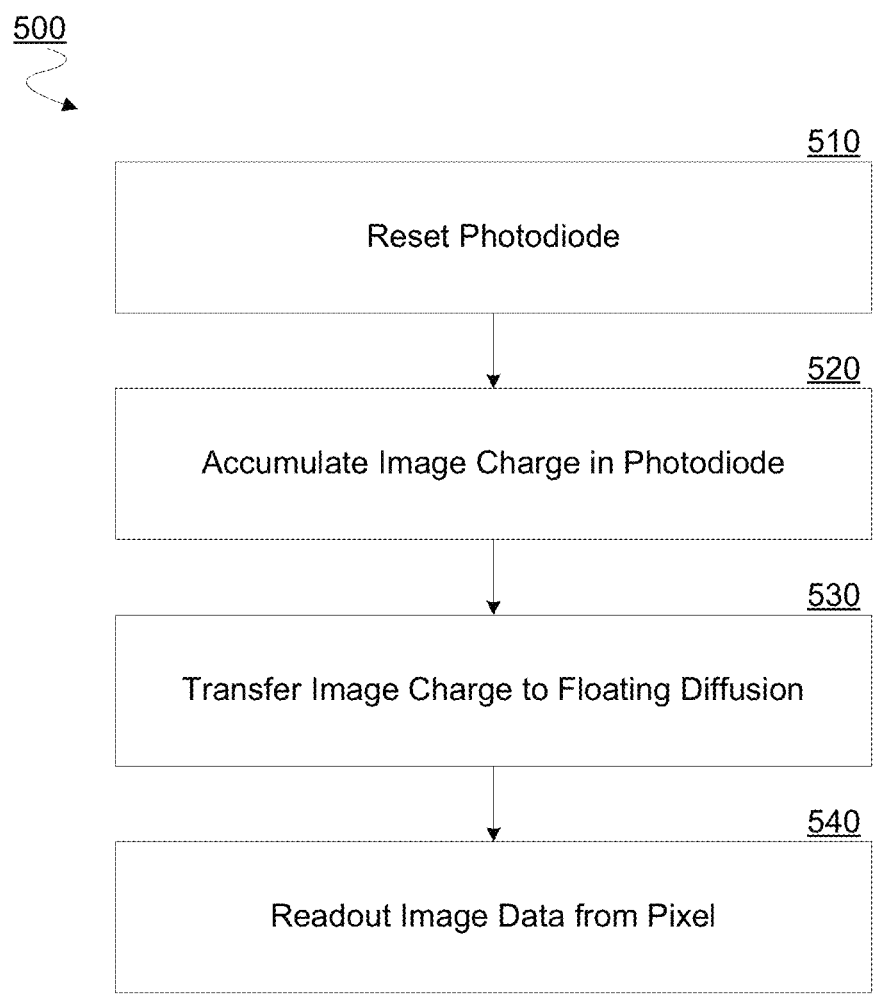
FIG. 5 is a flow diagram illustrating elements of a method for operating an imaging system according to an embodiment.

FIG. 5 is a flow chart illustrating elements of a process 500 for operating a pixel cell in accordance with an embodiment. Process 500 may implement operation of pixel cell such as that shown in pixel array 200, for example. In an embodiment, process 500 may be sequentially or concurrently executed with multiple respective pixels in pixel array 104—e.g. depending upon whether a rolling shutter or global shutter is used. The order in which some or all of the process blocks appear in process 500 should not be deemed limiting. Rather, one of ordinary skill in the art having the benefit of the present disclosure will understand that some of the process blocks may be executed in a variety of orders not illustrated.

In a process block 510, a photodiode (e.g., photodiode region PD 205) may be reset. Resetting may include discharging or charging photodiode to a predetermined voltage potential. Such reset may be achieved by asserting both a reset signal and a transfer signal—e.g. a reset signal RST to enable reset transistor 220 and a transfer signal TX to enable transfer transistor 210. Enabling a reset transistor and transfer transistor of the pixel cell may electrically couple the photodiode and a floating diffusion region of the pixel cell to a reset power line—e.g. a power rail VDD.

After the photodiode is reset, image acquisition by the photodiode may commence, at process block 520. For example, the reset signal and/or the transfer signal may be de-asserted to electrically isolate the photodiode for charge accumulation therein. In an embodiment, light incident on the pixel cell may be focused by a microlens and/or pass through a color filter layer onto the photodiode region. Such a color filter may operate to filter the incident light into component colors (e.g., using a Bayer filter mosaic or color filter array). The incident photons may cause charge to accumulate within the photodiode.

Once the image acquisition window has expired, the accumulated charge within the photodiode may, at process block 530, be transferred to the floating diffusion region—e.g. by asserting a transfer signal to the gate of the transfer transistor. In the case of a global shutter, the global shutter signal may be asserted simultaneously, as the transfer signal, to all pixels within pixel array 200 during process block 520. This may result in a global transfer of the respective image data accumulated by each pixel into the pixel's corresponding floating diffusion region—e.g. in FD 230. In an embodiment, a source follower supply trace for the source follower transistor includes a branch portion to increase capacitive coupling between the floating diffusion region and the source follower supply trace.

Once the image data is transferred, the transfer signal may be de-asserted to isolate the floating diffusion region from the photodiode, in preparation for a readout of image data from the pixel cell at process block 540. In an embodiment, the readout at block 540 may include a voltage of the floating diffusion region activating a source follower transistor (e.g. source follower transistor 240) coupled thereto. Such a source follower transistor may, for example, be coupled to a bitline for directly reading out the image data to the bitline as an analog signal. In various embodiments, readout may occur on a per row basis via column lines, on a per column basis via row lines, on a per pixel basis, or by other logical groupings. Once the image data of all pixels has been readout, process 500 may, in an embodiment, return to process block 510 to prepare for the next image.

In an embodiment, the readout of image data at 540 is based on a configuration of the pixel array—e.g. where the configuration is one of multiple configurations which are each to provide a different respective conversion gain. By way of illustration and not limitation, the pixel array may include one or more components to receive a control signal for a given level of conversion gain, where the control signal determines for one or more traces respective switched coupling to and/or switched decoupling from various readout circuitry.

Method 500 may further include transitioning switch circuitry of the pixel array between a first operational mode and a second operational mode. For example, the first operational mode and second operational mode may correspond, respectively, to the first operational mode and second operational mode discussed with respect to pixel array 200.

Techniques and architectures for sensing an image are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A pixel array comprising:
    a pixel cell including a source follower transistor and a row select transistor;
    a first trace coupled to the source follower transistor;
    a second trace to receive from the row select transistor an output of the pixel cell;
    switch circuitry including:
        a first transistor coupled to a supply voltage and the source follow transistor, wherein the first transistor is coupled to the source follower transistor via a first portion of the first trace;
        a second transistor coupled to a sample and hold circuit and the source follow transistor, wherein the second transistor is coupled to the source follower transistor via a second portion of the first trace;
        a third transistor coupled to the supply voltage and the row select transistor, wherein the third transistor is coupled to the row select transistor via a first portion of the second trace; and
        a fourth transistor coupled to the sample and hold circuit and the row select transistor, wherein the fourth transistor is coupled to the row select transistor via a second portion of the second trace;
    the switch circuitry to transition between a first operational mode and a second operational mode based on a control signal, the first operational mode including the first transistor and the fourth transistor each being in a respective active state and the second transistor and the third transistor each being in a respective inactive state, the second operational mode including the first transistor and the fourth transistor each being in a respective inactive state and the second transistor and the third transistor each being in a respective active state.

2. The pixel array of claim 1, wherein the source follower transistor comprises a gate and a first terminal, wherein the pixel cell further comprises a third trace coupled to a floating diffusion region of the pixel cell and the gate of the source follower transistor, and wherein the first trace comprises a trunk portion and a first branch portion extending from the first portion, wherein the first branch portion extends in parallel with and proximate to a portion of the third trace, wherein any connection point of the first branch portion for electrical connection to an element of the pixel cell is for electrical connection to the first terminal.

3. The pixel array of claim 2, the first branch portion comprising:

a first section which extends along a first line of direction in parallel with and proximate to a first side of the third trace; and
a second section which extends along a second line of direction in parallel with and proximate to a second side of the third trace.

4. The pixel array of claim 2, the first trace further comprising:
    a second branch portion extending from the trunk portion, wherein the second branch portion extends in parallel with and proximate to a portion of the third trace, wherein any connection point of the second branch portion for electrical connection to an element of the pixel cell is for electrical connection to the first terminal.

5. The pixel array of claim 2, wherein the third trace and the first trace are both in a first metal layer.

6. An image sensor system comprising: a pixel array including:
    a pixel cell comprising:
        a source follower transistor and a row select transistor;
        a first trace coupled to the source follower transistor;
        a second trace to receive from the row select transistor an output of the pixel cell;
        switch circuitry including:
            a first transistor coupled to a supply voltage and the source follow transistor, wherein the first transistor is coupled to the source follower transistor via a first portion of the first trace;
            a second transistor coupled to a sample and hold circuit and the source follow transistor, wherein the second transistor is coupled to the source follower transistor via a second portion of the first trace;
            a third transistor coupled to the supply voltage and the row select transistor, wherein the third transistor is coupled to the row select transistor via a first portion of the second trace; and
            a fourth transistor coupled to the sample and hold circuit and the row select transistor, wherein the fourth transistor is coupled to the row select transistor via a second portion of the second trace;
    the switch circuitry to transition between a first operational mode and a second operational mode based on a control signal, the first operational mode including the first transistor and the fourth transistor each being in a respective active state and the second transistor and the third transistor each being in a respective inactive state, the second operational mode including the first transistor and the fourth transistor each being in a respective inactive state and the second transistor and the third transistor each being in a respective active state.

7. The image sensor system of claim 6, further comprising control logic to provide the control signal to the switch circuitry.

8. The image sensor system of claim 6, wherein the source follower transistor comprises a gate and a first terminal, wherein the pixel cell further comprises a third trace coupled to a floating diffusion region of the pixel cell and the gate of the source follower transistor, and wherein the first trace comprises a trunk portion and a first branch portion extending from the first portion, wherein the first branch portion extends in parallel with and proximate to a portion of the third trace, wherein any connection point of the first branch portion for electrical connection to an element of the pixel cell is for electrical connection to the first terminal.

9. The image sensor system of claim 8, the first branch portion comprising:

a first section which extends along a first line of direction in parallel with and proximate to a first side of the third trace; and a second section which extends along a second line of direction in parallel with and proximate to a second side of the third trace.

10. The image sensor system of claim 8, the first trace further comprising:

a second branch portion extending from the trunk portion, wherein the second branch portion extends in parallel with and proximate to a portion of the third trace, wherein any connection point of the second branch portion for electrical connection to an element of the pixel cell is for electrical connection to the first terminal.

11. The image sensor system of claim 8, wherein the third trace and the first trace are both in a first metal layer.

12. A method comprising:

at a pixel cell of a pixel array:

accumulating charge at a photodiode in response to light incident upon the photodiode;

with a transfer transistor coupled to the photodiode and a floating diffusion node, bringing the floating diffusion node to a voltage level based on the accumulated charge; and outputting from a source follower transistor an amplification signal based on the floating diffusion node being brought to the voltage level, wherein the source follower transistor conducts current carried via a source follower first trace, wherein the pixel cell outputs an analog signal based on the amplification signal; and with a control signal, transitioning switch circuitry of the pixel array between a first operational mode and a second operational mode, the switch circuitry including:

a first transistor coupled to a supply voltage and the source follow transistor, wherein the first transistor is coupled to the source follower transistor via a first portion of the first trace;

a second transistor coupled to a sample and hold circuit and the source follow transistor, wherein the second transistor is coupled to the source follower transistor via a second portion of the first trace;

a third transistor coupled to the supply voltage and the row select transistor, wherein the third transistor is coupled to the row select transistor via a first portion of the second trace; and a fourth transistor coupled to the sample and hold circuit and the row select transistor, wherein the fourth transistor is coupled to the row select transistor via a second portion of the second trace;

wherein the first operational mode includes the first transistor and the fourth transistor each being in a respective active state and the second transistor and the third transistor each being in a respective inactive state, and wherein the second operational mode includes the first transistor and the fourth transistor each being in a respective inactive state and the second transistor and the third transistor each being in a respective active state.

13. The method of claim 12, wherein the source follower transistor comprises a gate and a first terminal, wherein the pixel cell further comprises a third trace coupled to a floating diffusion region of the pixel cell and the gate of the source follower transistor, and wherein the first trace comprises a trunk portion and a first branch portion extending from the first portion, wherein the first branch portion extends in parallel with and proximate to a portion of the third trace, wherein any connection point of the first branch portion for electrical connection to an element of the pixel cell is for electrical connection to the first terminal.

14. The method of claim 13, wherein the first branch portion comprises:

a first section which extends along a first line of direction in parallel with and proximate to a first side of the third trace; and a second section which extends along a second line of direction in parallel with and proximate to a second side of the third trace.

15. The method of claim 13, wherein the first trace further comprises:

a second branch portion extending from the trunk portion, wherein the second branch portion extends in parallel with and proximate to a portion of the third trace, wherein any connection point of the second branch portion for electrical connection to an element of the pixel cell is for electrical connection to the first terminal.

16. The method of claim 13, wherein the third trace and the first trace are both in a first metal layer.

* * * * *